United States Patent
Zheng et al.

(10) Patent No.: US 12,085,753 B2
(45) Date of Patent: Sep. 10, 2024

(54) OPTICAL MODULE (71) Applicant: Hisense Broadband Multimedia Technologies Co., Ltd., Shandong (CN)

(72) Inventors: Long Zheng, Shandong (CN); Sigeng Yang, Shandong (CN)

(73) Assignee: HISENSE BROADBAND MULTIMEDIA TECHNOLOGIES CO., LTD., Qingdao (CN)

(*) Notice: Subject to any disclaimer, the term of this patent is extended or adjusted under 35 U.S.C. 154(b) by 545 days.

(21) Appl. No.: 17/481,798

(22) Filed: Sep. 22, 2021

(65) Prior Publication Data

US 2022/0011510 A1 Jan. 13, 2022

Related U.S. Application Data

(63) Continuation-in-part of application No. PCT/CN2020/114571, filed on Sep. 10, 2020.

(30) Foreign Application Priority Data

May 21, 2020 (CN) .......................... 202010436947.2

(51) Int. Cl.
*H05K 3/32* (2006.01)
*G02B 6/13* (2006.01)
(Continued)

(52) U.S. Cl.
CPC .............. *G02B 6/13* (2013.01); *H05K 1/181* (2013.01); *H05K 1/182* (2013.01); *H05K 2201/10121* (2013.01); *H05K 2201/10287* (2013.01)

(58) Field of Classification Search
CPC .......... H05K 3/32; H05K 1/111; H05K 1/181; H05K 1/182; H05K 1/0216;
(Continued)

(56) References Cited

U.S. PATENT DOCUMENTS 4,686,492 A 8/1987 Grellmann et al.
6,492,667 B2 * 12/2002 Kamiya ................. H01L 23/66
257/691
(Continued)

FOREIGN PATENT DOCUMENTS

CN 102804372 A 11/2012
CN 106980158 A 7/2017
(Continued)

OTHER PUBLICATIONS

International Search Report and Written Opinion issued in corresponding International Application No. PCT/CN2020/114571 dated Dec. 29, 2020, with English translation.
(Continued)

*Primary Examiner* — Hoa C Nguyen
(74) *Attorney, Agent, or Firm* — Morgan, Lewis & Bockius LLP (57) ABSTRACT

An optical module includes a circuit board and a silicon optical chip. The circuit board includes a plurality of circuit board bonding pads. The silicon optical chip includes a plurality of chip bonding pads corresponding to the plurality of circuit board bonding pads. The plurality of chip bonding pads are electrically connected to the corresponding circuit board bonding pads, so that the silicon optical chip is electrically connected to the circuit board. A chip bonding pad is electrically connected to at least one corresponding circuit board bonding pad through a plurality of bonding wires, or a circuit board bonding pad is electrically connected to at least one corresponding chip bonding pad through a plurality of bonding wires. A connecting line of two or more of bonding positions of the plurality of bonding wires on the circuit board bonding pads is inclined with respect to a connecting line of centers of the circuit board bonding pads.

20 Claims, 7 Drawing Sheets

(51) Int. Cl.
*H05K 1/11* (2006.01)
*H05K 1/18* (2006.01)

(58) Field of Classification Search
CPC .......... H05K 2201/10121; H05K 2201/10287; G02B 6/13
See application file for complete search history.

(56) References Cited

U.S. PATENT DOCUMENTS

| | | | |
|---|---|---|---|
| 6,538,336 B1* | 3/2003 | Secker | H01L 23/5286 |
| | | | 257/E23.079 |
| 6,812,580 B1* | 11/2004 | Wenzel | H01L 23/49816 |
| | | | 257/E23.079 |
| 7,002,249 B2* | 2/2006 | Duffy | H01L 23/4952 |
| | | | 257/E23.079 |
| 7,161,239 B2* | 1/2007 | Zhao | H01L 23/49833 |
| | | | 257/E23.101 |
| 7,675,168 B2 | 3/2010 | Appel et al. | |
| 9,006,098 B2* | 4/2015 | Wyland | H01L 24/48 |
| | | | 257/773 |
| 9,123,713 B2* | 9/2015 | Crisp | H01L 24/49 |
| 2002/0153166 A1* | 10/2002 | Chang | H01L 23/49838 |
| | | | 257/E23.079 |
| 2005/0184403 A1* | 8/2005 | Inagawa | H01L 23/50 |
| | | | 257/E23.079 |
| 2010/0232128 A1* | 9/2010 | Haba | H01L 24/49 |
| | | | 361/783 |
| 2014/0071567 A1* | 3/2014 | Seta | H02H 9/046 |
| | | | 361/56 |
| 2014/0124565 A1 | 5/2014 | Haba et al. | |
| 2018/0317315 A1 | 11/2018 | Yang et al. | |

FOREIGN PATENT DOCUMENTS

| | | |
|---|---|---|
| CN | 108548102 A | 9/2018 |
| JP | 2000-252363 A | 9/2000 |

OTHER PUBLICATIONS

Office Action issued in corresponding Chinese Patent Application No. 202010436947.2 dated Mar. 17, 2022, with English translation.

* cited by examiner

OPTICAL MODULE

CROSS-REFERENCE TO RELATED APPLICATIONS

This application is a continuation in part of International Patent Application No. PCT/CN2020/114571 filed on Sep. 10, 2020, which claims benefit and priority to Chinese Patent Application No. 202010436947.2, filed on May 21, 2020, which are incorporated herein by reference in their entireties.

TECHNICAL FIELD

The present disclosure relates to the field of optical communication technologies, and in particular, to an optical module.

BACKGROUND

In the field of optical communication, a variety of electronic elements is encapsulated in an optical module. Interconnection between the electronic elements and connection between the electronic elements and a circuit board are achieved by virtue of wire bonding with using bonding wires, in particular, there are a large number of concentrated bonding wires between a silicon optical chip and the circuit board.

SUMMARY

An optical module is provided. The optical module includes a circuit board and a silicon optical chip. The circuit board includes a plurality of circuit board bonding pads. The silicon optical chip includes a plurality of chip bonding pads corresponding to the plurality of circuit board bonding pads. The plurality of chip bonding pads are electrically connected to the corresponding circuit board bonding pads, so that the silicon optical chip is electrically connected to the circuit board. A chip bonding pad is electrically connected to at least one corresponding circuit board bonding pad through a plurality of bonding wires, or a circuit board bonding pad is electrically connected to at least one corresponding chip bonding pad through a plurality of bonding wires. A connecting line of two or more bonding positions of the plurality of bonding wires on the circuit board bonding pads is inclined with respect to a connecting line of centers of the circuit board bonding pads.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Technical solutions in some embodiments of the present disclosure will be described clearly and completely below with reference to accompanying drawings. Obviously, the described embodiments are merely some but not all embodiments of the present disclosure. All other embodiments obtained on the basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" throughout the description and the claims are construed as open and inclusive, i.e., "including, but not limited to".

In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined by "first" and "second" may explicitly or implicitly include one or more of the features. In the description of the embodiments of the present disclosure, the term "a/the plurality of" means two or more unless otherwise specified.

In the description of some embodiments, the term "coupled" and "connected" and their extensions may be used. For example, the term "connected" may be used in the description of some embodiments to indicate that two or more components are in direct physical or electrical contact with each other. For another example, the term "coupled"

may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B, and C" has the same meaning as the phrase "at least one of A, B, or C", and both include the following combinations of A, B, and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" means an open and inclusive express, which does not exclude apparatuses that are applicable to or configured to perform additional tasks or steps.

The term "about", "substantially" and "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

In optical communication technology, an optical signal is used to carry information to be transmitted, and the optical signal carrying the information is transmitted to an information processing device such as a computer through an information transmission device such as an optical fiber or an optical waveguide to complete the transmission of the information. Since the optical signal has a characteristic of passive transmission when being transmitted through the optical fiber or the optical waveguide, low-cost and low-loss information transmission may be achieved. In addition, a signal transmitted by the information transmission device such as the optical fiber or the optical waveguide is an optical signal, while a signal that can be recognized and processed by the information processing device such as the computer is an electrical signal. Therefore, in order to establish information connection between the information transmission device such as the optical fiber or the optical waveguide and the information processing device such as the computer, interconversion between the electrical signal and the optical signal needs to be achieved.

An optical module implements a function of interconversion between the optical signal and the electrical signal in the field of optical fiber communication technology. The optical module includes an optical port and an electrical port. The optical port is configured to implement optical communication between the optical module and the information transmission device such as the optical fiber or the optical waveguide. The electrical port is configured to implement electrical connection between the optical module and an optical network terminal (e.g., an optical modem). The electrical connection is mainly to implement power supply, transmission of an I2C signal, transmission of a data signal and grounding. The optical network terminal transmits the electrical signal to the information processing device such as the computer through a network cable or wireless fidelity (Wi-Fi).

Figure 1A:
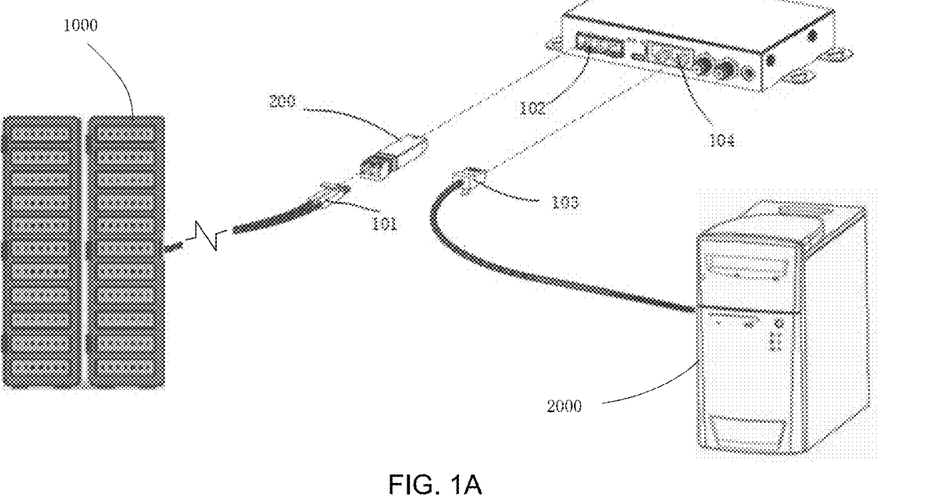
FIG. 1A is a diagram showing a connection relationship of an optical communication system, in accordance with some embodiments.
Figure 1B:
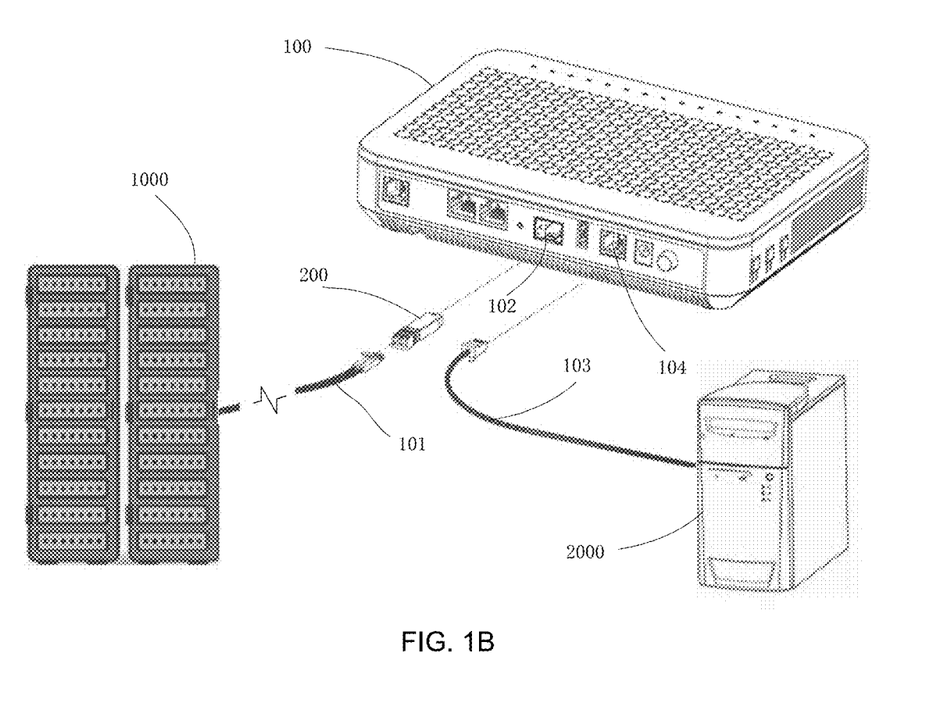
FIG. 1B is a diagram showing a connection relationship of another optical communication system, in accordance with some embodiments.

FIG. 1A is a diagram showing a connection relationship of an optical communication system in accordance with some embodiments, and FIG. 1B is a diagram showing a connection relationship of another optical communication system in accordance with some embodiments. As shown in FIGS. 1A and 1B, the optical communication system mainly includes a remote server 1000, a local information processing device 2000, an optical network terminal 100, an optical module 200, an optical fiber 101 and a network cable 103.

One terminal of the optical fiber 101 is connected to the remote server 1000, and the other terminal thereof is connected to the optical network terminal 100 through the optical module 200. The optical fiber itself may support long-distance signal transmission, such as several-kilometer (6-kilometer to 8-kilometer) signal transmission. On this basis, if a repeater is used, infinite-distance transmission may be achieved theoretically. Therefore, in a typical optical communication system, a distance between the remote server 1000 and the optical network terminal 100 may typically reach several kilometers, tens of kilometers, or hundreds of kilometers.

One terminal of the network cable 103 is connected to the local information processing device 2000, and the other terminal thereof is connected to the optical network terminal 100. The local information processing device 2000 is at least one of the followings: a router, a switch, a computer, a mobile phone, a tablet computer or a television.

A physical distance between the remote server 1000 and the optical network terminal 100 is greater than a physical distance between the local information processing device 2000 and the optical network terminal 100. Connection between the local information processing device 2000 and the remote server 1000 is completed by the optical fiber 101 and the network cable 103; and connection between the optical fiber 101 and the network cable 103 is completed by the optical module 200 and the optical network terminal 100.

The optical module 200 includes an optical port and an electrical port. The optical port is configured to access the optical fiber 101, so that the optical module 200 and the optical fiber 101 establish bidirectional optical signal connection; and the electrical port is configured to access the optical network terminal 100, so that the optical module 200 and the optical network terminal 100 establish bidirectional electrical signal connection. Interconversion between the optical signal and the electrical signal is achieved by the optical module 200, so that connection between the optical fiber 101 and the optical network terminal 100 is established. For example, an optical signal from the optical fiber 101 is converted into an electrical signal by the optical module 200 and then the electrical signal is input into the optical network terminal 100, and an electrical signal from the optical network terminal 100 is converted into an optical signal by the optical module 200 and then the optical signal is input into the optical fiber 101. Since the optical module 200 is a tool for achieving the interconversion between the optical signal and the electrical signal, and has no function of processing data, the information does not change in the above photoelectric conversion process.

The optical network terminal 100 includes a housing in a substantially cuboid shape, and an optical module interface 102 and a network cable interface 104 that are disposed on the housing. The optical module interface 102 is configured to access the optical module 200, so that the bidirectional electrical signal connection between the optical network terminal 100 and the optical module 200 is established; and the network cable interface 104 is configured to access the network cable 103, so that the bidirectional electrical signal connection between the optical network terminal 100 and the network cable 103 is established. Connection between the optical module 200 and the network cable 103 is established through the optical network terminal 100. For example, the optical network terminal 100 transmits an electrical signal from the optical module 200 to the network cable 103, and transmits an electrical signal from the network cable 103 to the optical module 200. Therefore, the optical network terminal 100, as a master monitor of the optical module 200, may monitor operation of the optical module 200. In addition to the optical network terminal 100, the master monitor of the optical module 200 may further include an optical line terminal (OLT).

A bidirectional signal transmission channel between the remote server 1000 and the local information processing device 2000 has been established through the optical fiber 101, the optical module 200, the optical network terminal 100 and the network cable 103.

Figure 2:
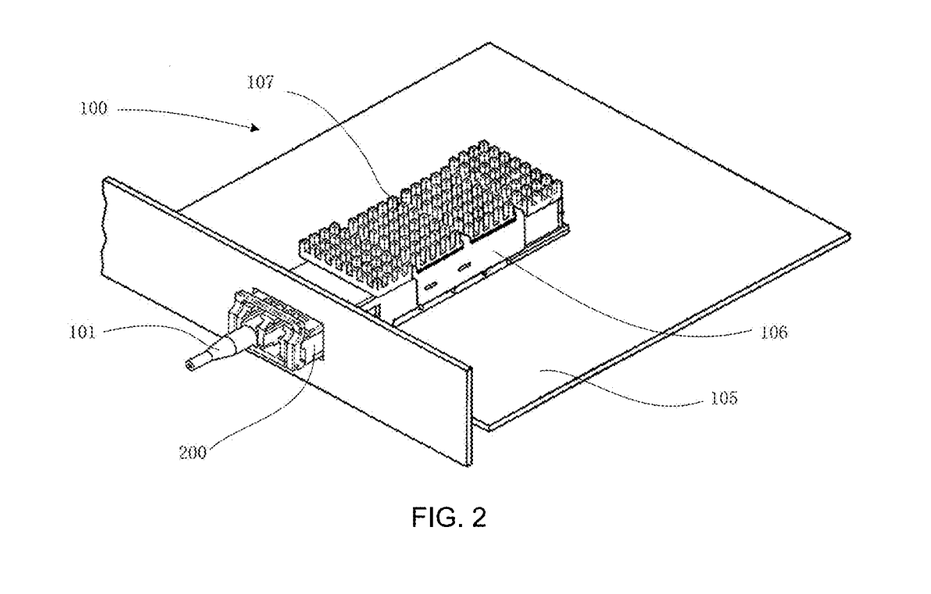
FIG. 2 is a diagram showing a structure of an optical network terminal, in accordance with some embodiments.

FIG. 2 is a diagram showing a structure of an optical network terminal in accordance with some embodiments. In order to clearly show a connection relationship between the optical module 200 and the optical network terminal 100, FIG. 2 only shows a structure of the optical network terminal 100 related to the optical module 200. As shown in FIG. 2, the optical network terminal 100 further includes a circuit board 105 disposed in the housing thereof, a cage 106 disposed on a surface of the circuit board 105, a heat sink 107 disposed on the cage 106, and an electrical connector disposed inside the cage 106. The electrical connector is configured to access the electrical port of the optical module 200; and the heat sink 107 has protruding portions such as fins that increase a heat dissipation area.

The optical module 200 is inserted into the cage 106 of the optical network terminal 100, the optical module 200 is fixed by the cage 106, and heat generated by the optical module 200 is conducted to the cage 106 and is dissipated through the heat sink 107. After the optical module 200 is inserted into the cage 106, the electrical port of the optical module 200 is connected to the electrical connector inside the cage 106, so that the bidirectional electrical signal connection between the optical module 200 and the optical network terminal 100 is established. In addition, the optical port of the optical module 200 is connected to the optical fiber 101, so that the bidirectional optical signal connection between the optical module 200 and the optical fiber 101 is established.

Figure 3:
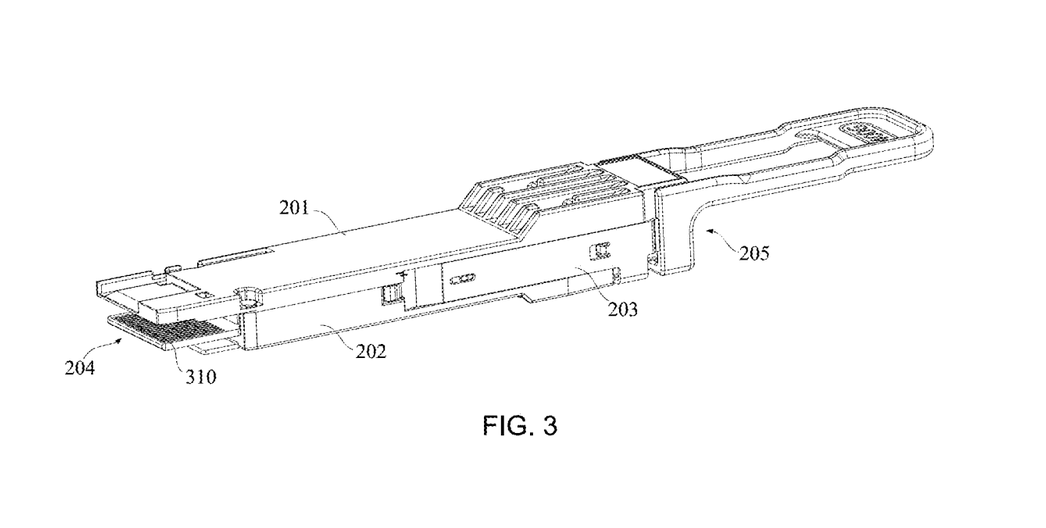
FIG. 3 is a diagram showing a structure of an optical module, in accordance with some embodiments.
Figure 4:
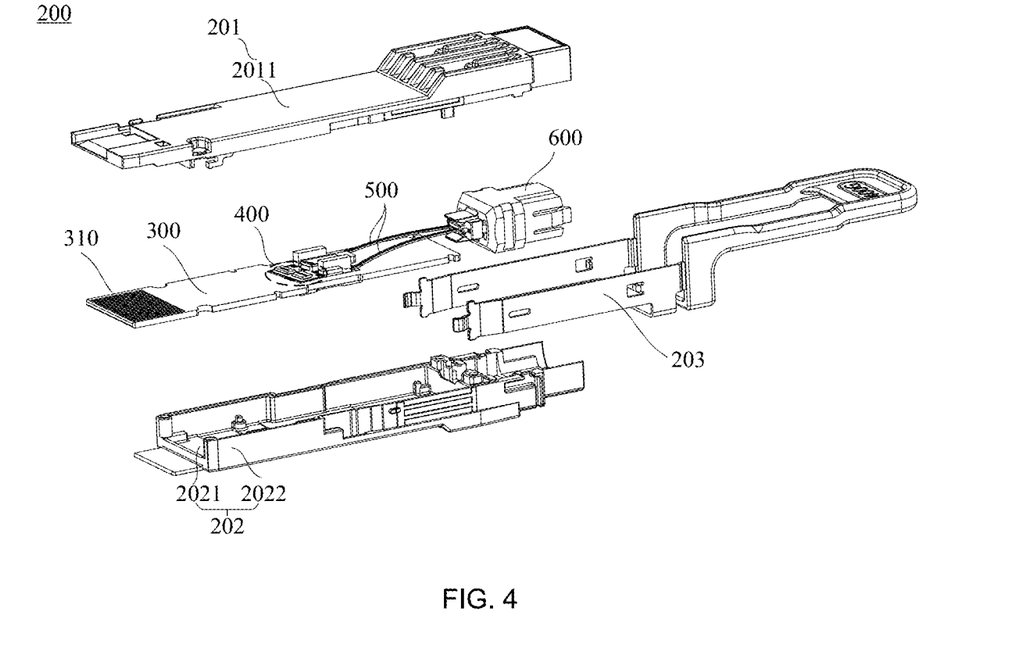
FIG. 4 is a diagram showing an exploded structure of an optical module, in accordance with some embodiments.

FIG. 3 is a diagram showing a structure of an optical module 200 in accordance with some embodiments, and FIG. 4 is a diagram of an exploded structure of an optical module 200 in accordance with some embodiments. As shown in FIGS. 3 and 4, the optical module 200 includes a shell, a circuit board 300 and a silicon optical chip 400 which are disposed in the shell.

The shell includes an upper shell 201 and a lower shell 202. The upper shell 201 covers the lower shell 202 to form the above shell with two openings 204 and 205, and an outer contour of the shell is generally in a cuboid shape.

In some embodiments, the lower shell 202 includes a bottom plate 2021 and two lower side plates 2022 located on both sides of the bottom plate 2021 respectively and disposed perpendicular to the bottom plate 2021; and the upper shell 201 includes a cover plate 2011, and the cover plate 2011 covers the two lower side plates 2022 of the lower shell 202 to form the above shell.

In some embodiments, the lower shell 202 includes a bottom plate and two lower side plates located on both sides of the bottom plate respectively and disposed perpendicular to the bottom plate; the upper shell 201 includes a cover plate and two upper side plates located on both sides of the cover plate respectively and disposed perpendicular to the cover plate; and the two upper side plates are combined with the two lower side plates respectively, so that the upper shell 201 covers the lower shell 202.

A direction in which a connecting line between the two openings 204 and 205 is located may be the same as a longitudinal direction of the optical module 200, or may not be the same as the longitudinal direction of the optical module 200. For example, the opening 204 is located at an end (a left end in FIG. 3) of the optical module 200, and the opening 205 is also located at an end (a right end in FIG. 3) of the optical module 200. Alternatively, the opening 204 is located at an end of the optical module 200, and the opening 205 is located on a side of the optical module 200. The opening 204 is an electrical port, a connecting finger 310 of the circuit board 300 extends from the electrical port 204, and is inserted into the master monitor (e.g., the optical network terminal 100); and the opening 205 is an optical port, which is configured to access an external optical fiber 101, so that the optical fiber 101 is connected to the silicon optical chip 400 inside the optical module 200.

By using an assembly mode of combining the upper shell 201 with the lower shell 202, it is possible to facilitate installation of optical components such as the circuit board 300 and the silicon optical chip 400 into the shell, and the upper shell 201 and the lower shell 202 may form encapsulation and protection for the components. In addition, when components such as the circuit board 300 and the silicon optical chip 400 are assembled, it is possible to facilitate arrangement of positioning parts, heat dissipation parts and electromagnetic shielding parts of these components, which is conducive to implementation of automated production.

In some embodiments, the upper shell 201 and the lower shell 202 are made of a metal material, which facilitates electromagnetic shielding and heat dissipation.

In some embodiments, the optical module 200 further includes an unlocking component 203 located on an outer wall of the shell thereof, and the unlocking component 203 is configured to implement or release a fixed connection between the optical module 200 and the master monitor.

For example, the unlocking component 203 is located on outer walls of the two lower side plates 2022 of the lower shell 202, and includes an engagement component that is matched with the cage of the master monitor (e.g., the cage 106 of the optical network terminal 100). When the optical module 200 is inserted into the cage of the master monitor, the optical module 200 is fixed in the cage of the master monitor by the engagement component of the unlocking component 203. When the unlocking component 203 is pulled, the engaging component of the unlocking component 203 moves with the pulling, and then a connection relationship between the engagement component and the master monitor is changed to release engagement between the optical module 200 and the master monitor, so that the optical module 200 may be drawn out of the cage of the master monitor.

The circuit board 300 includes a circuit wiring, electronic elements, chips, etc. Through the circuit wiring, the electronic elements and the chips are connected together according to a circuit design, so as to implement functions such as power supply, transmission of electrical signal, and grounding. The electronic elements may include, for example, capacitors, resistors, triodes or metal-oxide-semiconductor field-effect transistors (MOSFETs). The chips may include, for example, microcontroller units (MCUs), clock and data recovery (CDR) chips, power management chips or digital signal processing (DSP) chips.

The circuit board 300 is generally a rigid circuit board, and the rigid circuit board may also implement a load-bearing function due to its relatively hard material. For example, the rigid circuit board may stably bear the electronic elements and the chips, and may also be inserted into the electrical connector in the cage of the master monitor.

The circuit board 300 further includes a connecting finger 310 formed on a surface of an end thereof. The connecting finger 310 is composed of a plurality of pins separated from each other. The circuit board 300 is inserted into the cage 106, and is conductively connected to the electrical connector in the cage 106 through the connecting finger 310. The connecting finger 310 may be disposed on only one surface (e.g., an upper surface shown in FIG. 5) of the circuit board 300, or may be disposed on both upper and lower surfaces of the circuit board to adapt to an occasion with a demand for a large number of pins. The connecting finger 310 is configured to establish electrical connection with the master monitor, so as to implement power supply, grounding, I2C signal transmission, data signal transmission, etc.

Of course, flexible circuit boards are also used in some optical modules 200. As a supplement to the rigid circuit board, a flexible circuit board is generally used in conjunction with the rigid circuit board. For example, the circuit board 300 and the silicon optical chip 400 may be connected by the flexible circuit board instead of the circuit wiring.

In some embodiments, as shown in FIG. 4, the optical module 200 further includes an optical fiber ribbon 500 and an optical fiber socket 600. The silicon optical chip 400 is connected to one end of the optical fiber ribbon 500, and the other end of the optical fiber ribbon 500 is connected to the optical fiber socket 600. The silicon optical chip 400 is optically connected to the optical fiber socket 600 through the optical fiber ribbon 500. The optical fiber socket 600 forms the optical port 205, and is configured to be connected to the optical fiber 101 outside the optical module 200, so as to achieve optical connection between the silicon optical chip 400 and the optical fiber 101.

The silicon optical chip 400 is electrically connected to the circuit board 300 by wire bonding. An electrical signal from the circuit board 300 is converted into an optical signal by the silicon optical chip 400, and then the optical signal is transmitted to the optical fiber 101 through the optical fiber ribbon 500 and the optical fiber socket 600; and an optical signal from the optical fiber 101 is converted into an electrical signal by the silicon optical chip 400, and then the electrical signal is output to the circuit board 300. In this way, interconversion between the optical signal and the electrical signal is achieved.

In some embodiments, the silicon optical chip 400 is directly mounted on a surface of the circuit board 300.

In some embodiments, the circuit board 300 has a mounting groove. The silicon optical chip 400 is embedded in the mounting groove, and fixed on the shell of the optical module 200 (for example, fixed on the lower shell 202, and in this case, the mounting groove passing through the circuit board 300). Heat generated by the silicon optical chip 400 may be quickly dissipated through the shell of the optical module 200, which improves heat dissipation efficiency of the optical module 200.

For example, a size of the mounting groove is greater than a size of the silicon optical chip 400. That is, there is a gap between each side of the silicon optical chip 400 and an inner wall of the mounting groove. In this way, the heat generated by the silicon optical chip 400 is not conducted to the circuit board 300, and is directly conducted to the shell of the optical module 200, which further improves the heat dissipation efficiency of the optical module 200.

Figure 5:
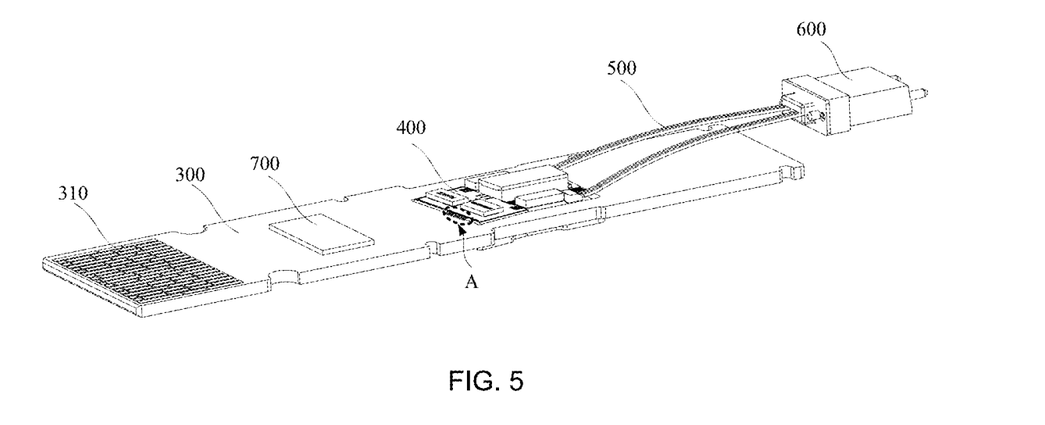
FIG. 5 is a diagram showing an assembly structure of a circuit board, a silicon optical chip and an optical fiber socket, in accordance with some embodiments.
Figure 6:
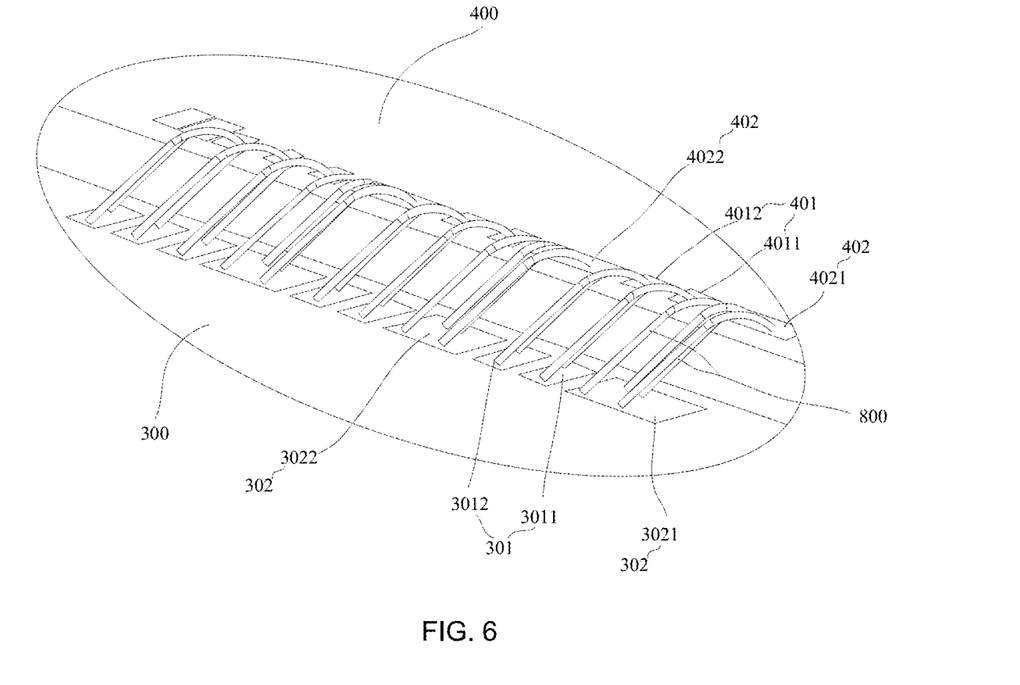
FIG. 6 is an enlarged view of part A in FIG. 5.

FIG. 5 is a diagram showing an assembly structure of a circuit board, a silicon optical chip and an optical fiber socket in accordance with some embodiments, and FIG. 6 is an enlarged view of part A in FIG. 5. As shown in FIGS. 5 and 6, the silicon optical chip 400 includes a plurality of chip bonding pads, for example, at least one signal transmission chip bonding pad 401 and at least one grounding chip bonding pad 402. The circuit board 300 includes a plurality of circuit board bonding pads corresponding to the plurality of chip bonding pads, for example, at least one signal transmission circuit board bonding pad 301 and at least one grounding circuit board bonding pad 302.

The at least one circuit board bonding pad is electrically connected to corresponding chip bonding pad(s) through a plurality of bonding wires. In some embodiments, each circuit board bonding pad is electrically connected to a corresponding chip bonding pad through a plurality of bonding wires. In some other embodiments, among the plurality of circuit board bonding pads, there is a circuit board bonding pad that is electrically connected to a corresponding chip bonding pad through a plurality of bonding wires, and there is another circuit board bonding pad that is electrically connected to a corresponding chip bonding pad through a bonding wire. In yet some other embodiments, among the plurality of the circuit board bonding pads, there is a circuit board bonding pad that is electrically connected to a corresponding chip bonding pad through a plurality of bonding wires, there is another circuit board bonding pad that is electrically connected to a corresponding chip bonding pad through a bonding wire, and there is yet another circuit board bonding pad that is electrically connected to a plurality of corresponding chip bonding pads through a plurality of bonding wires. In yet some other embodiments, among the plurality of circuit board bonding pads, there is a circuit board bonding pad that is electrically connected to a corresponding chip bonding pad through a plurality of bonding wires, there is another circuit board bonding pad that is electrically connected to a corresponding chip bonding pad through a bonding wire, and there are a plurality of other circuit board bonding pads that are electrically connected to a corresponding chip bonding pad through a bonding wire, respectively.

Signals processed by the silicon optical chip 400 include a data signal and a grounding signal. In order to achieve grounding and transmission of data signal (input and output of the data signal), the signal transmission chip bonding pad 401 in the silicon optical chip 400 is configured to achieve the transmission of the data signal, the grounding chip bonding pad 402 in the silicon optical chip 400 is configured to achieve grounding, the signal transmission circuit board bonding pad 301 in the circuit board 300 is configured to achieve the transmission of the data signal, and the grounding circuit board bonding pad 302 in the circuit board 300 is configured to achieve grounding.

As shown in FIG. 6, an area of the signal transmission circuit board bonding pad 301 is less than an area of the grounding circuit board bonding pad 302, and an area of the signal transmission chip bonding pad 401 is less than an area of the grounding chip bonding pad 402.

Figure 9A:
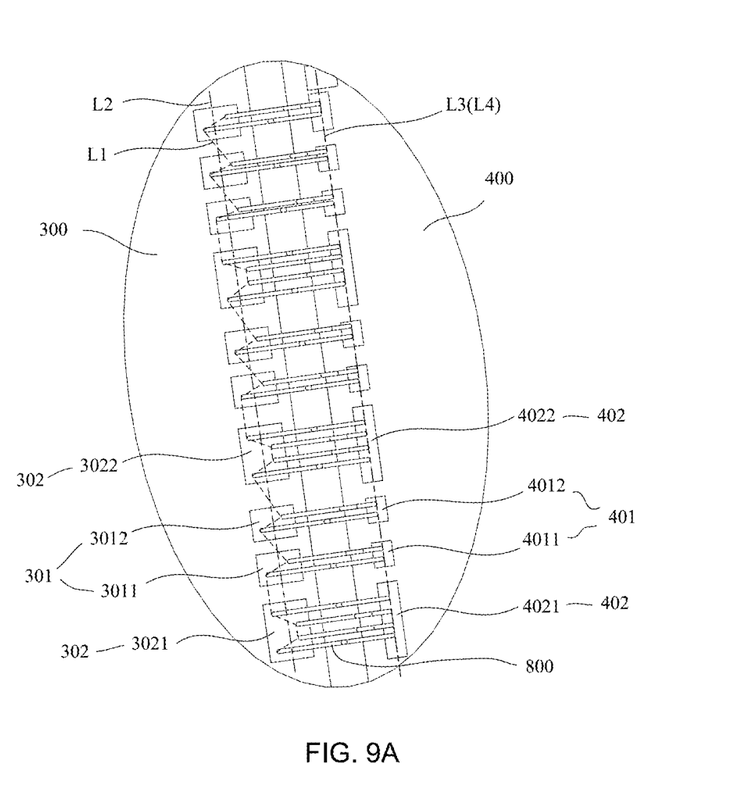
FIG. 9A is an enlarged view of part B in FIG. 8.

The present disclosure does not limit the number of signal transmission chip bonding pads 401, grounding chip bonding pads 402, signal transmission circuit board bonding pads 301 and grounding circuit board bonding pads 302, which may be one, two, three or more. For example, FIGS. 6 and 9A show a plurality of signal transmission chip bonding pads 401, a plurality of grounding chip bonding pads 402, a plurality of signal transmission circuit board bonding pads 301, and a plurality of grounding circuit board bonding pads 302.

Signal transmission chip bonding pad(s) 401 are electrically connected to corresponding signal transmission circuit board bonding pad(s) 301. The signal transmission circuit board bonding pad(s) 301 are electrically connected to the electronic elements and the chips in the circuit board 300 through the circuit wiring in the circuit board 300, so as to achieve the transmission of the data signal between the silicon optical chip 400 and the circuit board 300.

Grounding chip bonding pad 402(s) are electrically connected to corresponding grounding circuit board bonding pad(s) 302. The grounding circuit board bonding pad(s) 302 are electrically connected to a grounding wire (for example, a large-area copper foil) in the circuit board 300, so as to achieve grounding of the silicon optical chip 400. In general, the grounding wire in the circuit board 300 is electrically connected to a grounding wire in the optical network terminal 100 through the electrical port of the optical module 200, and the grounding wire in the optical network terminal 100 is connected to the ground through a grounding wire in a power plug of the optical network terminal 100.

In some embodiments, a signal transmission chip bonding pad 401 corresponds to a signal transmission circuit board bonding pad 301, and a grounding chip bonding pad 402 corresponds to a grounding circuit board bonding pad 302. In this case, each signal transmission chip bonding pad 401 is electrically connected to a corresponding signal transmission circuit board bonding pad 301 through a plurality of bonding wires 800, so as to achieve the transmission of the data signal between the silicon optical chip 400 and the circuit board 300. Each grounding chip bonding pad 402 is electrically connected to a corresponding grounding circuit board bonding pad 302 through a plurality of bonding wires, so as to achieve the grounding of the silicon optical chip 400.

In some embodiments, a plurality of signal transmission chip bonding pads 401 correspond to a signal transmission circuit board bonding pad 301, and a plurality of grounding chip bonding pads 402 correspond to a grounding circuit board bonding pad 302. In this case, each signal transmission chip bonding pads 401 is electrically connected to the corresponding signal transmission circuit board bonding pad 301 through a bonding wire 800, so as to achieve the transmission of the data signal between the silicon optical chip 400 and the circuit board 300. Each grounding chip bonding pad 402 is electrically connected to the corresponding grounding circuit board bonding pad 302 through a bonding wire 800, so as to achieve grounding of the silicon optical chip 400.

Since each of the plurality of signal transmission chip bonding pads 401 is electrically connected to the signal transmission circuit board bonding pad 301 through a bonding wire, the transmission of the data signal is achieved through a plurality of bonding wires. Since each of the plurality of grounding chip bonding pads 402 is electrically connected to the grounding circuit board bonding pad 302 through a bonding wire, the grounding is achieved through a plurality of bonding wires.

In some embodiments, a signal transmission chip bonding pad 401 corresponds to a plurality of signal transmission circuit board bonding pads 301, and a grounding chip bonding pad 402 corresponds to a plurality of grounding circuit board bonding pads 302. In this case, each signal transmission circuit board bonding pad 301 is electrically connected to the corresponding signal transmission chip bonding pad 401 through a bonding wire 800, so as to achieve the transmission of the data signal between the silicon optical chip 400 and the circuit board 300. Each grounding circuit board bonding pad 302 is electrically connected to the corresponding grounding chip bonding pad 402 through a bonding wire 800, so as to achieve the grounding of the silicon optical chip 400.

Since each of the plurality of signal transmission circuit board bonding pads 301 is electrically connected to the signal transmission chip bonding pad 401 through a bonding wire, the transmission of the data signal is achieved through a plurality of bonding wires. Since each of the plurality of grounding circuit board bonding pads 302 is electrically connected to the grounding chip bonding pad 402 through a bonding wire, the grounding is achieved through a plurality of bonding wires.

A description will be made below by taking an example in which a signal transmission chip bonding pad 401 corresponds to a signal transmission circuit board bonding pad 301, and a grounding chip bonding pad 402 corresponds to a grounding circuit board bonding pad 302.

Figure 7:
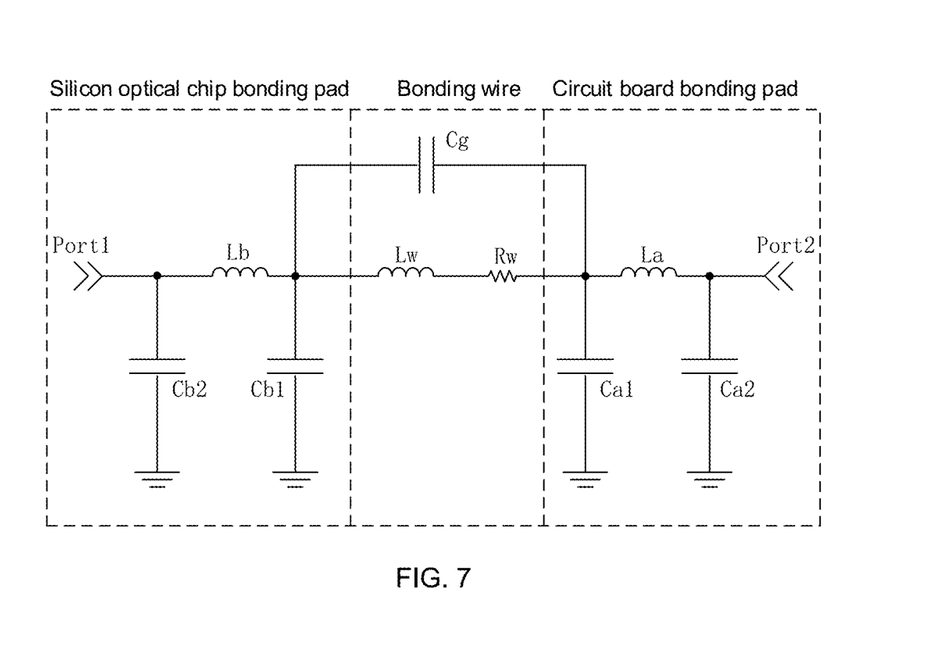
FIG. 7 is a diagram of an equivalent circuit model of bonding wire(s), in accordance with some embodiments.

FIG. 7 is a diagram of an equivalent circuit model of a connection system of a chip bonding pad and a circuit board bonding pad in accordance with some embodiments. As shown in FIG. 7, Port1 is the bonding pad on the silicon optical chip 400, Port2 is the bonding pad on the circuit board 300; Lb is an equivalent inductance of the chip bonding pad, Cb2 and Cb1 are parasitic capacitance of the chip bonding pad; Cg is distributed capacitance of the bonding wire(s) connecting the chip bonding pad and the circuit board bonding pad, Lw is an equivalent inductance of the bonding wire(s), Rw is an equivalent resistance of the bonding wire(s); La is an equivalent inductance of the circuit board bonding pad; and Ca1 and Ca2 are parasitic capacitance of the circuit board bonding pad. In order to ensure a high-speed signal processing performance of the silicon optical chip 400 and the circuit board 300, a bandwidth of the bonding line(s) needs to be increased. The bandwidth is used to indicate an ability of a communication line to transmit data. A common unit of the bandwidth is bps (bit per second), which means how many bits of data the communication line can transmit per second. Generally speaking, the bandwidth of the bonding line(s) is related to the equivalent resistance and the equivalent inductance of the bonding wire(s).

The equivalent inductance of a bonding wire is as follows:

$$Lw=2*lw*[\text{Ln}(4*10^3*lw/d)-0.75] \tag{1}$$

Formula (1) is a formula for calculating the equivalent inductance of the bonding line, where Lw is the equivalent inductance of the bonding wire, and a unit thereof is nH; lw is a length of the bonding wire, and a unit thereof is mm; d is a diameter of the bonding wire, and a unit thereof is um; Ln is a natural logarithm; and *indicates that left and right numbers, symbols or formulas thereof have a multiplication relationship.

According to formula (1), in a case where the number of bonding wires is a multiple (for example, 2 or more), a length of the plurality of bonding wires does not change compared with one bonding wire. However, a diameter d of the plurality of bonding wires as a whole increases, and an equivalent inductance Lw thereof decreases.

The equivalent resistance of the bonding wire is as follows:

$$Rw=\rho(lw/S) \tag{2}$$

Formula (2) is a formula for calculating the equivalent resistance of the bonding wire(s), where Rw is the equivalent resistance of the bonding wire; ρ is resistivity of the bonding wire; lw is the length of the bonding wire; and S is a cross-sectional area of the bonding wire.

According to formula (2), in a case where the number of bonding wires is a multiple (for example, 2 or more), the length of the plurality of bonding wires does not change compared with one bonding wire, but a cross-sectional area S thereof increases. Therefore, an equivalent resistance Rw of the plurality of bonding wires as a whole decreases.

$$Z=Rw+j*W*Lw$$

$$|Z|\sqrt{Rw^2+(W*Lw)^2} \quad (3)$$

Formula (3) is a formula for calculating impedance of the bonding wire, where Z is the impedance of the bonding wire(s), Lw is the equivalent inductance of the bonding wire, Rw is the equivalent resistance of the bonding wire, and W is the bandwidth. It can be seen that when the number of bonding wires increases, the equivalent inductance Lw and the equivalent resistance Rw of the the plurality of bonding wires as a whole decrease. According to formula (3), it can be seen that when the impedance of the bonding wires remains unchanged, the equivalent resistance Rw decreases, the equivalent inductance Lw decreases, and the bandwidth W increases.

Therefore, in a case where the number of bonding wires 800 connecting the signal transmission chip bonding pad 401 and the signal transmission circuit board bonding pad 301 is at least two, the equivalent inductance and the equivalent resistance of the plurality of bonding wires as a whole decrease, the bandwidth of the plurality of bonding wires 800 connecting the signal transmission chip bonding pad 401 and the signal transmission circuit board bonding pad 301 as a whole increases, and the signal transmission rate increases.

In some embodiments, the at least one signal transmission chip bonding pad 401 and the at least one grounding chip bonding pad 402 are arranged alternatively. For example, two signal transmission chip bonding pads 401 and one grounding chip bonding pad 402 are arranged alternatively. That is, there are two signal transmission chip bonding pads 401 between every two adjacent grounding chip bonding pads 402 in the silicon optical chip 400.

As shown in FIG. 6, the at least one signal transmission chip bonding pad 401 includes two signal transmission chip bonding pads 401, which are a first chip bonding pad 4011 and a second chip bonding pad 4012. The at least one grounding chip bonding pad 402 includes two grounding chip bonding pads 402, which are a third chip bonding pad 4021 and a fourth chip bonding pad 4022. The first chip bonding pad 4011 and the second chip bonding pad 4012 are located between the third chip bonding pad 4021 and the fourth chip bonding pad 4022.

Of course, one signal transmission chip bonding pad 401 and one grounding chip bonding pad 402 may be arranged alternatively, three signal transmission chip bonding pads 401 and one grounding chip bonding pad 402 may be arranged alternatively, or two signal transmission chip bonding pads 401 and two grounding chip bonding pads 402 may also be arranged alternatively.

Similarly, the at least one signal transmission circuit board bonding pad 301 and the at least one grounding circuit board bonding pad 302 are arranged alternatively. For example, two signal transmission circuit board bonding pads 301 and one grounding circuit board bonding pad 302 are arranged alternatively. That is, there are two signal transmission circuit board bonding pads 301 between every two adjacent grounding circuit board bonding pads 302 in the circuit board 300.

As shown in FIG. 6, the at least one signal transmission circuit board bonding pad 301 includes two signal transmission circuit board bonding pads 301, which are a first circuit board bonding pad 3011 and a second circuit board bonding pad 3012. The at least one grounding circuit board bonding pad 302 includes two grounding circuit board bonding pads 302, which are a third circuit board bonding pad 3021 and a fourth circuit board bonding pad 3022. The first circuit board bonding pad 3011 and the second circuit board bonding pad 3012 are located between the third circuit board bonding pad 3021 and the fourth circuit board bonding pad 3022.

The grounding chip bonding pad(s) 402 are disposed between the signal transmission chip bonding pads 401. The circuit board 300 is provided with grounding circuit board bonding pad(s) 302 corresponding to the grounding chip bonding pad(s) 402 therein, and the grounding chip bonding pad(s) 402 are connected to the grounding circuit board bonding pad(s) 302. In this way, isolation between the signal transmission chip bonding pads 401 may be improved, and as many return paths as possible are provided for the high-speed transmission data signal, so as to prevent crosstalk between the plurality of bonding wires 800 connecting the circuit board 300 and the silicon optical chip 400, and to ensure a quality of the high-speed transmission data signal.

Figure 8:
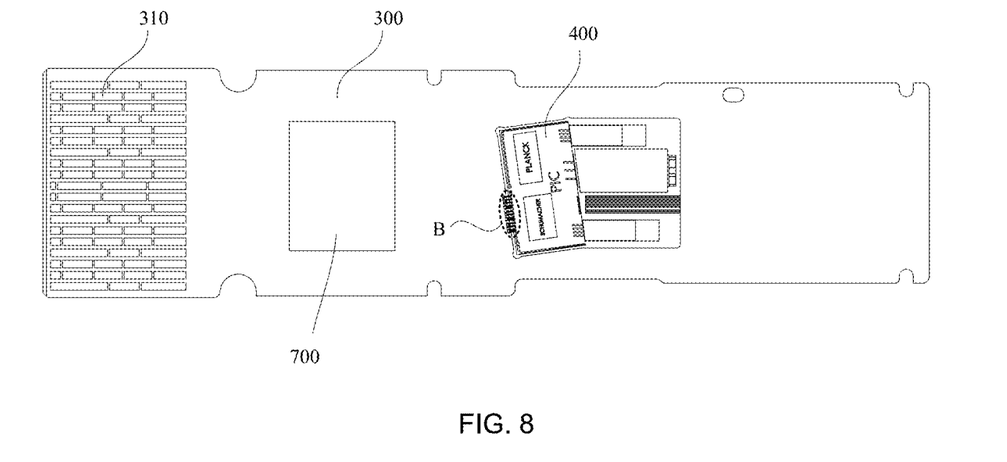
FIG. 8 is a top view of FIG. 5 omitting an optical fiber socket and an optical fiber ribbon.
Figure 10:
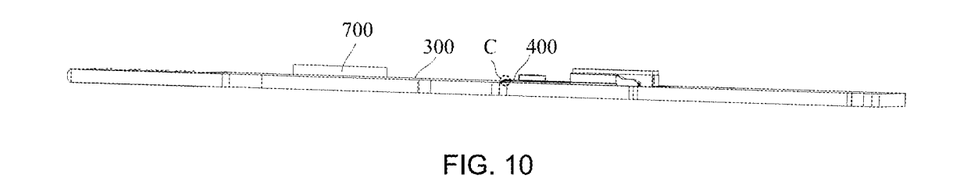
FIG. 10 is a side view of FIG. 5 omitting an optical fiber socket and an optical fiber ribbon.

In some embodiments of the present disclosure, as shown in FIGS. 5, 8 and 10, the circuit board 300 further includes a digital signal processing (DSP) chip 700, and the DSP chip 700 is disposed between the connecting finger 310 and the silicon optical chip 400 of the circuit board 300. An optical signal from the outside of the optical module 200 is converted into a differential signal through the silicon optical chip 400. The differential signal is processed by the DSP chip 700, and then output to the optical network terminal 100 through the connecting finger 310. An electrical signal from the outside of the optical module 200 (for example, the optical network terminal 100) is transmitted to the DSP chip 700 through the connecting finger 310, and is processed by the DSP chip 700, so that a differential signal is formed, and then the differential signal is output to the silicon optical chip 400.

The DSP chip 700 is electrically connected to the circuit wiring in the circuit board 300, and the circuit board 300 is electrically connected to the silicon optical chip 400, so that the high-speed differential signal output by the silicon optical chip 400 is transmitted to the DSP chip 700 through the circuit wiring in the circuit board 300, or the high-speed differential signal output by the DSP chip 700 is transmitted to the silicon optical chip 400 through the circuit wiring in the circuit board 300.

In some embodiments, the chip bonding pads of the silicon optical chip 400 are sequentially arranged along a side of the silicon optical chip 400, so that centers of the chip bonding pads are in a straight line, and the straight line is parallel to the above side of the silicon optical chip 400. In some embodiments, a center of a chip bonding pad refers to a substantially geometric center of the chip bonding pad. For example, when the chip bonding pad is in a shape of a rectangle, the geometric center is substantially an intersection of its two diagonals. When the chip bonding pad is in a shape of a circle, the geometric center is substantially a center of the circle. The number of the chip bonding pads of the silicon optical chip 400 may be set according to actual needs, which is not specifically limited in the present disclosure.

Similarly, the circuit board bonding pads of the circuit board 300 are also sequentially arranged along the above side of the silicon optical chip 400, so that centers of the circuit board bonding pads are in a straight line, and the straight line is parallel to the above side of the silicon optical chip 400. In some embodiments, a center of a circuit board bonding pad refers to a substantially geometric center of the circuit board bonding pad. It can be seen that a distance between the center of each circuit board bonding pad and the center of the corresponding chip bonding pad is equal.

Since the distance between the center of each circuit board bonding pad and the center of the corresponding chip bonding pad is equal, a length of a group of bonding wires connecting a pair of a chip bonding pad and a circuit board bonding pad may be the same as a length of another group of bonding wires connecting another pair of a chip bonding pad and a circuit board bonding pad. Each group of bonding wires are parallel to each other. In this case, two groups of bonding wires 800 between two adjacent signal transmission chip bonding pads 401 and corresponding signal transmission circuit board bonding pads 301 may be used as a differential pair for transmitting the differential signal. Since a phase difference of the differential signal is 180 degrees, the two groups of bonding wires may eliminate a common-mode signal, which may effectively enhance an anti-interference performance of the differential pair and reduce their energy radiation to the outside.

In some embodiments, as for the first chip bonding pad 4011 and the second chip bonding pad 4012 which are adjacent, a group of bonding wires (also referred to as a group of signal wires) connecting the first chip bonding pad 4011 and the corresponding first circuit board bonding pad 3011 and another group of bonding wires (also referred to as another group of signal wires) connecting the second chip bonding pad 4012 and the corresponding second circuit board bonding pad 3012 are used as a differential pair for transmitting the differential signal. Generally speaking, when the number of differential pairs is M (M is equal to or greater than 2, i.e. M≥2), one grounding chip bonding pad 402 and one grounding circuit board bonding pad 302 need to be disposed between every two adjacent differential pairs. The grounding chip bonding pad 402 is electrically connected to the grounding circuit board bonding pad 302 through at least one bonding wire (also referred to as at least one grounding wire), so that a signal wire which is adjacent to a grounding wire in each differential pair and the grounding wire form a return path. For example, when the number of the differential pairs is M (M≥2), the number of grounding chip bonding pads 402, grounding circuit board bonding pads 302 or grounding wires each is at least (M−1).

Of course, the number of grounding wires connecting one grounding chip bonding pad 402 and one grounding circuit board bonding pad 302 may also be two, three or more, which is not limited in the present disclosure. The number of grounding chip bonding pads 402 and grounding circuit board bonding pads 302 disposed between every two adjacent differential pairs may also be two or more, which are not limited in the present disclosure.

When the number of differential pairs is M (M≥2) in a structure formed by all differential pairs, there are two differential pairs located on an outermost side of the structure, and the two differential pairs may be referred to as outermost differential pairs. In the outermost differential pairs, there is a group of inside signal wires and a group of outside signal wires. It can be seen from the above that the grounding wire is generally disposed between two adjacent differential pairs, therefore, the outside signal wires are farther away from the grounding wire adjacent to the outermost differential pairs than the inside signal wires, so that the outside signal wires cannot form a short return path with the grounding line. Therefore, in order to enable each signal wire in the outermost differential pairs to form a short return path, there is a need to provide a grounding chip bonding pad 402 and a grounding circuit board bonding pad 302 on a side of the outside signal lines in each of the outermost differential pairs that is far away from the above grounding wire. The grounding chip bonding pad 402 and the grounding circuit board bonding pad 302 are electrically connected by at least one grounding wire.

Since there are two outermost differential pairs, there is a need to additionally provide two grounding chip bonding pads 402 and two grounding circuit board bonding pads 302. Therefore, when the number of differential pairs is M (M≥2) the number of grounding chip bonding pads 402, grounding circuit board bonding pads 302, or grounding wires each may be (M−1)+2, i.e., (M+1). In this way, grounding wires are disposed on both sides of each differential pair. Each signal wire in the differential pair and its adjacent grounding wire may form a return path, so that a differential signal transmitted by each differential pair may have a short return path, which may reduce energy radiation and effectively reduce crosstalk between the signal wires.

In order to provide more return paths for the high-speed transmission data signal to effectively prevent signal crosstalk, the number of bonding wires 800 connecting the grounding chip bonding pad 402 and the grounding circuit board bonding pad 302 is greater than or equal to the number of bonding wires 800 connecting the signal transmission chip bonding pad 401 and the signal transmission circuit board bonding pad 301.

In some embodiments, the number of bonding wires connecting the grounding chip bonding pad 402 and the corresponding grounding circuit board bonding pad 302 may be an integral multiple of the number of bonding wires connecting the signal transmission chip bonding pad 401 and the corresponding signal transmission circuit board bonding pad 301. For example, the number of bonding wires connecting the grounding chip bonding pad 402 and the corresponding grounding circuit board bonding pad 302 is a twice of the number of bonding wires connecting the signal transmission chip bonding pad 401 and the corresponding signal transmission circuit board bonding pad 301.

Figure 11:
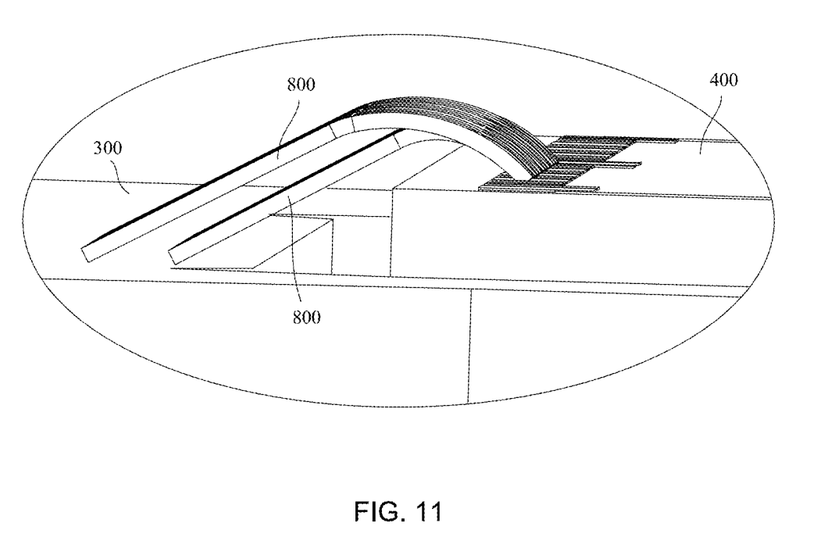
FIG. 11 is an enlarged view of part C in FIG. 10.

FIG. 8 is a top view of FIG. 5, FIGS. 9A-9C are enlarged views of part B in FIG. 8, FIG. 10 is a side view of FIG. 5, and FIG. 11 is an enlarged view of part C in FIG. 10. In FIGS. 8, 9A-9C, 10 and 11, a description may be made by taking an example in which the number of bonding wires connecting the first chip bonding pad 4011 and the corresponding first circuit board bonding pad 3011, and the number of bonding wires connecting the second chip bonding pad 4012 and the corresponding second circuit board bonding pad 3012 are both two, and the number of bonding wires connecting the third chip bonding pad 4021 and the corresponding third circuit board bonding pad 3021, and the number of bonding wires connecting the fourth chip bonding pad 4022 and the corresponding fourth circuit board bonding pad 3022 are both four.

Since the first chip bonding pad 4011 and the corresponding first circuit board bonding pad 3011 are connected by two bonding wires 800, signal crosstalk may occur between the two bonding wires 800. In order to prevent crosstalk between the two bonding wires, bonding positions of the two bonding wires 800 need to be different. As shown in FIGS. 8 and 9A, a connecting line L1 (the dash line in FIG. 9A) of bonding positions of the two bonding wires 800 on the first circuit board bonding pad 3011, the two bonding wires 800 connecting the first chip bonding pad 4011 and the corresponding first circuit board bonding pad 3011, is not parallel to (e.g., inclined with respect to) the connecting line L2 (the dash-and-dot line in FIG. 9A) of the centers of the circuit board bonding pads 3011. In the two bonding wires 800 connecting the first chip bonding pad 4011 and the corresponding first circuit board bonding pad 3011, a bonding position of one bonding wire is located on a front side of the first circuit board bonding pad 3011, and a bonding position of another bonding wire is located on a rear side of the first circuit board bonding pad 3011. The front side refers to a side of the first circuit board bonding pad 3011 that is closer to the first chip bonding pad 4011 than the connecting line L2 of the centers of the circuit board bonding pads, and the rear side refers to a side of the first circuit board bonding pad 3011 that is farther away from to the first chip bonding pad 4011 than the connecting line L2 of the centers of the circuit board bonding pads.

As shown in FIGS. 8 and 9A, in the two bonding wires 800 connecting the second chip bonding pad 4012 and the corresponding second circuit board bonding pad 3012, a bonding position of one bonding wire is located on a front side of the second circuit board bonding pad 3012, and a bonding position of another bonding wire is located on a rear side of the second circuit board bonding pad 3012.

That is, the bonding wires 800 connecting each of the plurality of signal transmission circuit board bonding pads 301 and the corresponding signal transmission chip bonding pad 401 use the same bonding manner as described above. A front-to-rear distribution of the bonding positions makes the bonding wires be distributed in front and rear rows as a whole.

The third chip bonding pad 4021 is connected to the third circuit board bonding pad 3021 through four bonding wires 800, a connecting line L1 (the dash line in FIG. 9A) of bonding positions of four bonding wires 800 on the third circuit board bonding pad 3021 is not parallel (e.g, inclined with respect to) to the connecting line L2 (the dash-and-dot line in FIG. 9A) of the centers of the circuit board bonding pads 3011. That is, the bonding positions of the four bonding wires 800 on the third circuit board bonding pad 3021 are not in the same straight line, but are distributed in two rows. For example, bonding positions of two middle bonding wires are located on a front side of the third circuit board bonding pad 3021, and bonding positions of two bonding wires on both sides are located on a rear side of the third circuit board bonding pad 3021. The front side refers to a side of the third circuit board bonding pad 3021 that is closer to the first chip bonding pad 4011 than the connecting line L2 of the centers of the circuit board bonding pads, and the rear side refers to a side of the third circuit board bonding pad 3021 that is farther away from to the first chip bonding pad 4011 than the connecting line L2 of the centers of the circuit board bonding pads.

As shown in FIGS. 8 and 9A, in the four bonding wires 800 connecting the fourth chip bonding pad 4022 and the corresponding fourth circuit board bonding pad 3022, bonding positions of two middle bonding wires are located on a front side of the fourth circuit board bonding pad 3022, and bonding positions of two bonding wires on both sides are on a rear side of the fourth circuit board bonding pad 3022.

That is, the bonding wire 800 connecting each of the plurality of grounding circuit board bonding pads 302 and the corresponding grounding chip bonding pad 402 use the same bonding manner as described above. A front-to-rear distribution of the bonding positions makes the bonding wires be distributed in front and rear rows as a whole.

As shown in FIGS. 10 and 11, in the two bonding wires connecting the first chip bonding pad 4011 and the first circuit board bonding pad 3011, the bonding wire 800 whose bonding position is located on the front side of the first circuit board bonding pad 3011 is relatively smooth, and the bonding wire 800 whose bonding position is located on the rear side of the first circuit board bonding pad 301 is relatively steep. That is, radians of the two bonding wires 800 are different. Therefore, viewed from a side, a height of the bonding wire whose bonding position is located on the rear side of the first circuit board bonding pad 3011 is larger than a height of the bonding wire whose bonding position is located on the front side of the first circuit board bonding pad 301. The two bonding wires do not overlap, and there is an angle between the two bonding wires. There is no mutual inductance between the bonding wires with the angle, which avoids an induced voltage generated by coupling of the two bonding wires (i.e., forming crosstalk), so as to ensure a signal transmission quality of the bonding wires connecting the first chip bonding pad 4011 and the first circuit board bonding pad 3011.

Based on the same principle, a signal transmission quality of the bonding wires connecting the second chip ponding pad 4012 and the second circuit board bonding pad 3012 may be ensured. A grounding effect of the bonding wires connecting the third chip ponding pad 4021 and the third circuit board bonding pad 3021, and a grounding effect of the bonding wires connecting the fourth chip ponding pad 4022 and the fourth circuit board bonding pad 3022 may be ensured.

As shown in FIG. 9A, the first chip bonding pad 4011 and the corresponding first circuit board bonding pad 3011 are connected by the two bonding wires 800. The bonding positions of the two bonding wires 800 on the first chip bonding pad 4011 are in a same row. That is, a connection line L3 (the dash line in FIG. 9A) of bonding positions of the two bonding wires 800 on the first chip bonding pad 4011 is parallel to a connection line L4 (the chain-dotted line in FIG. 9A) of centers of the chip bonding pads. In FIG. 9A, the connection line L3 and the connection line L4 coincide with each other.

Figure 9B:
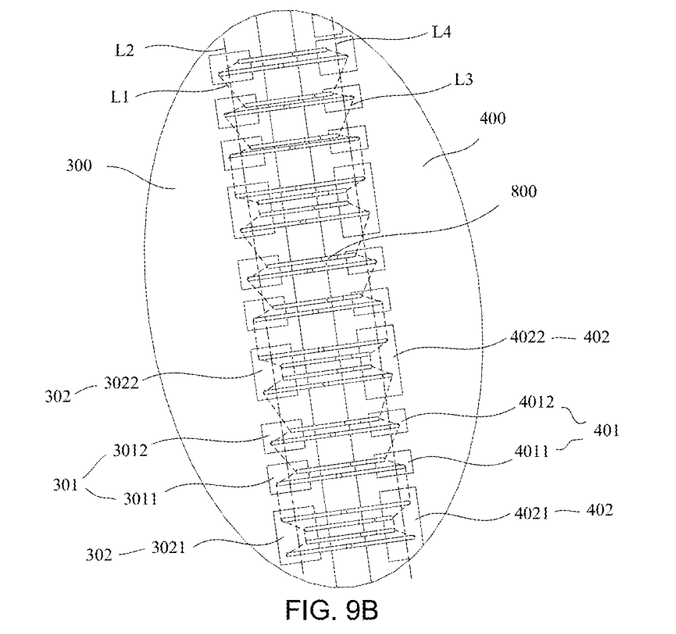
FIG. 9B is another enlarged view of part B in FIG. 8.
Figure 9C:
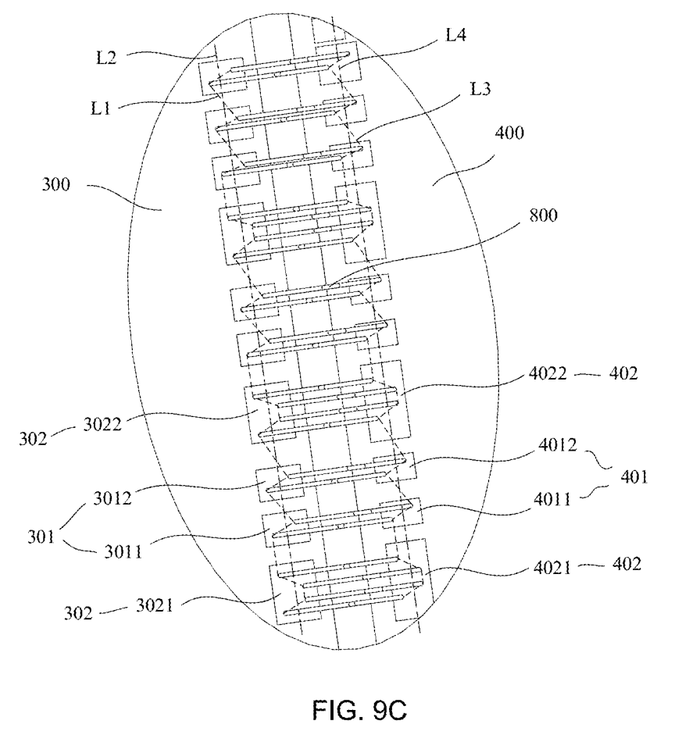
FIG. 9C is yet another enlarged view of part B in FIG. 8.

However, it is not limited to this. As shown in FIGS. 9B and 9C, the bonding positions of the two bonding wires 800 on the first chip bonding pad 4011 may also be disposed in rear and front positions. That is, a bonding position of one bonding wire 800 on the first chip bonding pad 4011 is located on a front side of the first chip bonding pad 4011, and a bonding position of another bonding wire 800 on the first chip bonding pad 4011 is located on a rear side of the first chip bonding pad 4011. The front side refers to a side of the first chip bonding pad 4011 that is closer to the first circuit board bonding pad 3011 than the connecting line L4 of the centers of the chip bonding pads, and the rear side refers to a side of the first chip bonding pad 4011 that is farther away from to the first circuit board bonding pad 3011 than the connecting line L4 of the centers of the chip bonding pads. As shown in FIGS. 9B and 9C, in the two bonding wires 800 connecting the second chip bonding pad 4012 and the corresponding second circuit board bonding pad 3012, a bonding position of one bonding wire is located on a front side of the second chip bonding pad 4012, and a bonding position of another bonding wire is located on a rear side of the second chip bonding pad 4012.

In the four bonding wires 800 connecting the third chip bonding pad 4021 and the corresponding third circuit board bonding pad 3021, bonding positions of two middle bonding wires are located on a front side of the third chip bonding pad 4021, bonding positions of two bonding wires on both sides is located on a rear side of the third chip bonding pad 4021.

In the four bonding wires 800 connecting the fourth chip bonding pad 4022 and the corresponding fourth circuit board bonding pad 3022, bonding positions of two middle bonding wires are located on a front side of the fourth chip bonding pad 4022, and bonding position of two bonding wires on both sides is located on a rear side of the fourth chip bonding pad 4022.

In some embodiments, the bonding wires that connect each first chip bonding pad 4011 and the corresponding first circuit board bonding pad 3011 and whose bonding positions are located on the rear side of the first circuit board bonding pad 3011 have a same height. That is, viewed from a side, these bonding wires coincide.

The bonding wires that connect each first chip bonding pad 4011 and the corresponding first circuit board bonding pad 3011 and whose bonding positions are located on the front side of the first circuit board bonding pad 3011 have a same height. That is, viewed from a side, these bonding wires coincide.

In addition, the bonding wires that connect each second chip bonding pad 4012 and the corresponding second circuit board bonding pad 3012 and whose bonding positions are located on the rear side of the second circuit board bonding pad 3012, the bonding wires that connect each third chip bonding pad 4021 and the corresponding third circuit board bonding pad 3021 and whose bonding positions are located on the rear side of the third circuit board bonding pad 3021, and the bonding wires that connects each fourth chip bonding pad 4022 and the corresponding fourth circuit board bonding pad 3022 and whose bonding position are located on the rear side of the fourth circuit board bonding pad 3022 all have a same height as the bonding wires that connects each first chip bonding pad 4011 and the corresponding first circuit board bonding pad 3011 and whose bonding positions are located on the rear side of the first circuit board bonding pad 3011. That is, viewed from a side, these bonding wires coincide.

The bonding wires that connect each second chip bonding pad 4012 and the corresponding second circuit board bonding pad 3012 and whose bonding positions are located on the front side of the second circuit board bonding pad 3012, the bonding wires that connect each third chip bonding pad 4021 and the corresponding third circuit board bonding pad 3021 and whose bonding positions are located on the front side of the third circuit board bonding pad 3021, and the bonding wires that connects each fourth chip bonding pad 4022 and the corresponding fourth circuit board bonding pad 3022 and whose bonding position are located on the front side of the fourth circuit board bonding pad 3022 all have a same height as the bonding wires that connects each first chip bonding pad 4011 and the corresponding first circuit board bonding pad 3011 and whose bonding positions are located on the front side of the first circuit board bonding pad 3011. That is, viewed from a side, these bonding wires coincide.

In this way, viewed from a side, in the bonding wires connecting the circuit board 300 and the silicon optical chip 400, the bonding wires whose bonding positions are located on the rear sides of the circuit board bonding pads coincide with each other, and the bonding wires whose bonding positions are located on the front sides of the circuit board bonding pads coincide with each other. In this way, the electrical connection between the silicon optical chip 400 and the circuit board 300 is more regular, which facilitates manufacture of the optical module 200.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. An optical module, comprising:
   a circuit board including a plurality of circuit board bonding pads;
   a silicon optical chip including a plurality of chip bonding pads corresponding to the plurality of circuit board bonding pads, wherein
   the plurality of chip bonding pads are electrically connected to the corresponding circuit board bonding pads, so that the silicon optical chip is electrically connected to the circuit board;
   a chip bonding pad is electrically connected to at least one corresponding circuit board bonding pad through a plurality of bonding wires, or a circuit board bonding pad is electrically connected to at least one corresponding chip bonding pad through a plurality of bonding wires; and
   a connecting line of two or more of bonding positions of the plurality of bonding wires on the circuit board bonding pads is inclined with respect to a connecting line of centers of the circuit board bonding pads.

2. The optical module according to claim 1, wherein a connecting line of bonding positions of the plurality of bonding wires on the chip bonding pads is parallel to a connecting line of centers of the chip bonding pads.

3. The optical module according to claim 1, wherein a connecting line of two or more of bonding positions of the plurality of bonding wires on the chip bonding pads is inclined with respect to a connecting line of centers of the chip bonding pads.

4. The optical module according to claim 1, wherein
   the plurality of chip bonding pads include at least one signal transmission chip bonding pad and at least one grounding chip bonding pad;
   the plurality of circuit board bonding pads include at least one signal transmission circuit board bonding pad corresponding to the at least one signal transmission chip bonding pad and at least one grounding circuit board bonding pad corresponding to the at least one grounding chip bonding pad; and
   a signal transmission chip bonding pad is electrically connected to at least one corresponding signal transmission circuit board bonding pad through the plurality of bonding wires, or a signal transmission circuit board bonding pad is electrically connected to at least one corresponding signal transmission chip bonding pad through the plurality of bonding wires.

5. The optical module according to claim 4, wherein a signal transmission chip bonding pad is electrically connected to a corresponding signal transmission circuit board bonding pad through two bonding wires;

a connecting line of bonding positions of the two bonding wires on the signal transmission circuit board bonding pad is inclined with respect to the connecting line of the centers of the circuit board bonding pads, so that a height of a bonding wire located on a front side of the signal transmission circuit board bonding pad is different from a height of a bonding wire located on a rear side of the signal transmission circuit board bonding pad; and the front side of the signal transmission circuit board bonding pad is a side thereof that is closer to the silicon optical chip than the connecting line of the centers of the circuit board bonding pads, and the rear side of the signal transmission circuit board bonding pad is a side thereof that is farther away from the silicon optical chip than the connecting line of the centers of the circuit board bonding pads.

6. The optical module according to claim 5, wherein heights of the plurality of bonding wires whose bonding positions are located on the front side of each signal transmission circuit board bonding pad are same; and heights of the plurality of bonding wires whose bonding positions are located on the rear side of each signal transmission circuit board bonding pad are same.

7. The optical module according to claim 5, wherein a connecting line of bonding positions of the two bonding wires on the signal transmission chip bonding pad is parallel to a connecting line of centers of the chip bonding pads.

8. The optical module according to claim 5, wherein a bonding position of one of the two bonding wires on the signal transmission chip bonding pad is located on a front side of the signal transmission chip bonding pad, and a bonding position of another of the two bonding wires on the signal transmission chip bonding pad is located on a rear side of the signal transmission chip bonding pad; and the front side of the signal transmission chip bonding pad is a side thereof that is closer to the circuit board than a connecting line of centers of the chip bonding pads, and the rear side of the signal transmission chip bonding pad is a side thereof that is farther away from the circuit board than the connecting line of the centers of the chip bonding pads.

9. The optical module according to claim 5, wherein a grounding circuit board bonding pad is electrically connected to a corresponding grounding chip bonding pad through four bonding wires, and bonding positions of two middle bonding wires on the grounding circuit board bonding pad and bonding positions of two bonding wires on both sides on the grounding circuit board bonding pad are distributed in two rows; and a height of bonding wires located on a front side of the grounding circuit board bonding pad is different from a height of bonding wires located on a rear side of the grounding circuit board bonding pad.

10. The optical module according to claim 9, wherein heights of the plurality of bonding wires whose bonding positions are located on the front side of each grounding circuit board bonding pad are same; and heights of the plurality of bonding wires whose bonding positions are located on the rear side of each grounding circuit board bonding pad are same.

11. The optical module according to claim 9, wherein a connecting line of bonding positions of the four bonding wires on the grounding chip bonding pad is parallel to a connecting line of centers of the chip bonding pads.

12. The optical module according to claim 9, wherein bonding positions of the two middle bonding wires on the grounding chip bonding pad and bonding positions of the two bonding wires on the both sides on the grounding chip bonding pad are distributed in two rows.

13. The optical module according to claim 4, wherein at least one signal transmission chip bonding pad is arranged alternatively with at least one grounding chip bonding pad, and at least one signal transmission circuit board bonding pad is arranged alternatively with at least one grounding circuit board bonding pad.

14. The optical module of claim 13, wherein every two signal transmission chip bonding pads are arranged alternatively with the at least one grounding chip bonding pad, and every two signal transmission circuit board bonding pads are arranged alternatively with the at least one grounding circuit board bonding pad.

15. The optical module according to claim 14, wherein bonding wires connecting every two adjacent signal transmission chip bonding pads and corresponding signal transmission circuit board bonding pads form a differential pair, and there are a grounding chip bonding pad and a grounding circuit board bonding pad between every two differential pairs;

a number of differential pairs is M, and a number of grounding chip bonding pads or a number of grounding circuit board bonding pads each is M minus 1 (M−1); and M is an integer greater than 1.

16. The optical module according to claim 15, wherein in a structure including all differential pairs, there are two outermost differential pairs located on an outermost side of the structure, and there are a grounding chip bonding pad and a grounding circuit board bonding pad on an outside of each of the two outermost differential pairs;

the number of the differential pairs is M, the number of the ground chip bonding pads or the number of the ground circuit board bonding pads each is M plus 1 (M+1); and M is the integer greater than 1.

17. The optical module according to claim 14, wherein a number of bonding wires connecting a grounding chip bonding pad and at least one corresponding grounding circuit board bonding pad is greater than or equal to a number of bonding wires connecting a signal transmission chip bonding pad and at least one corresponding signal transmission circuit board bonding pad; or, a number of bonding wires connecting a grounding circuit board bonding pad and at least one corresponding grounding chip bonding pad is greater than or equal to a number of bonding wires connecting a signal transmission circuit board bonding pad and at least one corresponding signal transmission chip bonding pad.

18. The optical module according to claim 17, wherein the number of the bonding wires connecting the grounding chip bonding pad and the at least one corresponding grounding circuit board bonding pad is a multiple of the number of the bonding wires connecting the signal transmission chip bonding pad and the at least one corresponding signal transmission circuit board bonding pad; or, the number of the bonding wires connecting the grounding circuit board bonding pad and the at least one corresponding grounding chip bonding pad is a multiple of the number of the bonding wires connecting the signal transmission circuit board bonding pad and the at least one corresponding signal transmission chip bonding pad.

19. The optical module according to claim 18, wherein
the number of the bonding wires connecting the grounding chip bonding pad and the at least one corresponding grounding circuit board bonding pad is twice of the number of the bonding wires connecting the signal transmission chip bonding pad and the at least one corresponding signal transmission circuit board bonding pad; or, the number of the bonding wires connecting the grounding circuit board bonding pad and the at least one corresponding grounding chip bonding pad is twice of the number of the bonding wires connecting the signal transmission circuit board bonding pad and the at least one corresponding signal transmission chip bonding pad.

20. The optical module according to claim 1, wherein
the chip bonding pads of the silicon optical chip are sequentially arranged along a side of the silicon optical chip, so that centers of the chip bonding pads are in a straight line, and the straight line is parallel to the side of the silicon optical chip; and the circuit board bonding pads of the circuit board are sequentially arranged along the side of the silicon optical chip, so that the centers of the circuit board bonding pads are in a straight line, and the straight line is parallel to the side of the silicon optical chip.

* * * * *